United States Patent
Kumar et al.

(10) Patent No.: US 12,273,117 B2
(45) Date of Patent: Apr. 8, 2025

(54) LOW NOISE PHASE LOCK LOOP (PLL) CIRCUIT

(71) Applicant: STMicroelectronics International N.V., Geneva (CH)

(72) Inventors: Anand Kumar, Noida (IN); Prashutosh Gupta, Ballia (IN)

(73) Assignee: STMicroelectronics International N.V., Geneva (CH)

( * ) Notice: Subject to any disclaimer, the term of this patent is extended or adjusted under 35 U.S.C. 154(b) by 262 days.

(21) Appl. No.: 17/969,251

(22) Filed: Oct. 19, 2022

(65) Prior Publication Data

US 2023/0163769 A1     May 25, 2023

Related U.S. Application Data

(60) Provisional application No. 63/281,808, filed on Nov. 22, 2021.

(51) Int. Cl.
| | | |
|---|---|---|
| *H03L 7/197* | (2006.01) | |
| *H03L 7/089* | (2006.01) | |
| *H03L 7/093* | (2006.01) | |
| *H03L 7/099* | (2006.01) | |

(52) U.S. Cl.
CPC .......... *H03L 7/1974* (2013.01); *H03L 7/0893* (2013.01); *H03L 7/093* (2013.01); *H03L 7/0995* (2013.01); *H03L 2207/06* (2013.01)

(58) Field of Classification Search
CPC ..... H03L 7/0893; H03L 7/093; H03L 7/0898; H03L 7/0891; H03L 7/18; H03L 7/06; H03L 7/08; H03L 7/085; H03L 7/089; H03L 7/0895; H03L 7/0896

See application file for complete search history.

(56) References Cited

U.S. PATENT DOCUMENTS

| | | | | |
|---|---|---|---|---|
| 5,491,439 A | * | 2/1996 | Kelkar | H03L 7/095 331/25 |
| 7,332,972 B2 | | 2/2008 | Vandel | |
| 7,750,695 B2 | * | 7/2010 | Caplan | H03L 7/0898 327/148 |
| 8,531,218 B1 | | 9/2013 | Chen | |
| 8,810,292 B2 | * | 8/2014 | Katsushima | H03L 7/0893 327/148 |
| 2007/0298747 A1 | | 12/2007 | Wu | |
| 2011/0012652 A1 | | 1/2011 | Amanna et al. | |
| 2012/0063244 A1 | | 3/2012 | Kwon et al. | |

* cited by examiner

*Primary Examiner* — Diana J. Cheng
(74) *Attorney, Agent, or Firm* — Crowe & Dunlevy LLC

(57) ABSTRACT

A phase lock loop (PLL) circuit includes a phase-frequency detector (PFD) circuit that determines a difference between a reference clock signal and a feedback clock signal to generate up/down control signals responsive to that difference. Charge pump and loop filter circuitry generates an integral signal component control signal and a proportional signal component control signal in response to the up/down control signals. The integral signal component control signal and proportional signal component control signal are separate control signals. A voltage controlled oscillator generates an oscillating output signal having a frequency controlled by the integral signal component control signal and the proportional signal component control signal. A divider circuit performs a frequency division on the oscillating output signal to generate the feedback clock signal.

18 Claims, 6 Drawing Sheets

LOW NOISE PHASE LOCK LOOP (PLL) CIRCUIT

CROSS REFERENCE TO RELATED APPLICATIONS

This application claims priority from U.S. Provisional Application for Patent No. 63/281,808, filed Nov. 22, 2021, the disclosure of which is incorporated herein by reference.

TECHNICAL FIELD

The present invention generally relates to a phase lock loop (PLL) circuit and, in particular, to a PLL circuit with a low noise operating characteristic.

BACKGROUND

A phase lock loop (PLL) circuit is used to generate an oscillating output signal for input in a number of circuit applications. It is important for the oscillating output signal to exhibit a low-noise characteristic.

SUMMARY

In an embodiment, a phase lock loop (PLL) circuit comprises: a phase-frequency detector (PFD) circuit configured to determine a difference between a reference clock signal and a feedback clock signal and generate up/down control signals in response to said difference; a first charge pump operating in response to the up/down control signals to generate a first charge pump current; a loop filter comprising a capacitor but no resistor that filters the first charge pump signal to generate a control voltage; a second charge pump operating in response to the up/down control signals to generate a second charge pump current; a voltage controlled oscillator comprising: a first transconductance circuit controlled by said control voltage to generate a first transconductance current; a current summing node configured to sum the first transconductance current with the second charge pump current to generate a control current; and a current controlled oscillator configured to generate an oscillating output signal having a frequency controlled by said control current; and a divider circuit configured to frequency divide the oscillating output signal to generate the feedback clock signal.

In an embodiment, a phase lock loop (PLL) circuit comprises: a phase-frequency detector (PFD) circuit configured to determine a difference between a reference clock signal and a feedback clock signal and generate up/down control signals in response to said difference; charge pump and loop filter circuitry configured to generate an integral signal component control signal and a proportional signal component control signal in response to said up/down control signals; wherein said integral signal component control signal and said proportional signal component control signal are separate control signals; a voltage controlled oscillator configured to generate an oscillating output signal having a frequency controlled by said integral signal component control signal and said proportional signal component control signal; and a divider circuit configured to frequency divide the oscillating output signal to generate the feedback clock signal.

BRIEF DESCRIPTION OF THE DRAWINGS

For a better understanding of the embodiments, reference will now be made by way of example only to the accompanying figures in which.

DETAILED DESCRIPTION

Figure 1:
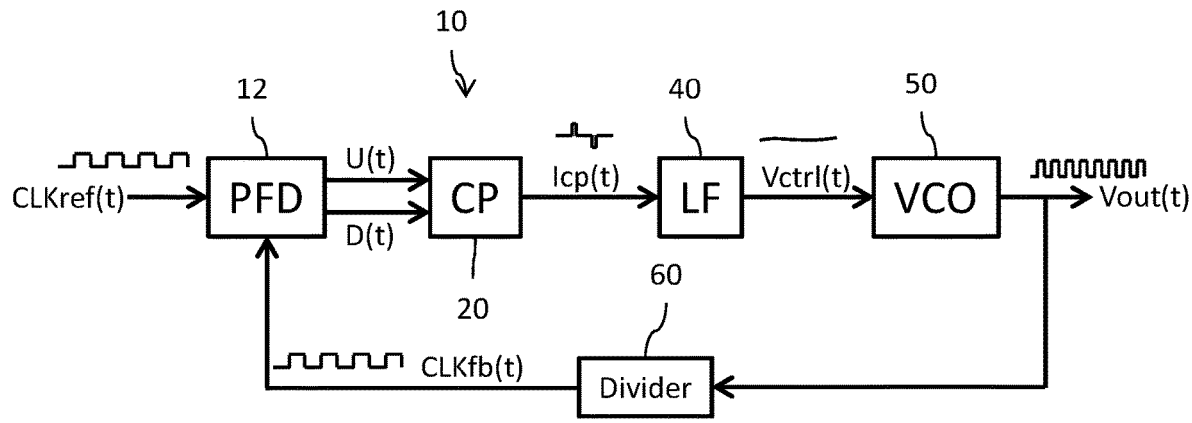
FIG. 1 is a block diagram of a phase lock loop (PLL) circuit.

Reference is made to FIG. 1 showing a block diagram of a phase lock loop (PLL) circuit 10. A phase-frequency detector (PFD) circuit 12 has a first input that receives a reference clock signal CLKref(t) and a second input that receives a feedback clock signal CLKfb(t). The PFD circuit 12 measures the difference between like edges (i.e., rising edges or falling edges) of the reference clock signal CLKref(t) and the feedback clock signal CLKfb(t). In the case where the PFD circuit 12 detects that the like edges of the reference clock signal CLKref(t) and the feedback clock signal CLKfb(t) are aligned, an up signal U(t) is pulsed and a down signal D(t) is pulsed (the two pulses being synchronized and having a same duration of time). If the PFD circuit 12 detects a situation where the edge of the reference clock signal CLKref(t) leads the like edge of the feedback clock signal CLKfb(t), an up signal U(t) is pulsed for a first duration of time and the down signal D(t) is pulsed for a second duration of time (less than the first duration), where the length of the first duration is dependent on the error in phase between the like edges. Conversely, if the edge of the feedback clock signal CLKfb(t) leads the like edge of the reference clock signal CLKref(t), the PFD circuit 12 pulses the down signal D(t) for a third duration of time and pulses the up signal U(t) for a fourth duration of time (less than the third duration), where the length of the third duration is dependent on the error in phase between the like edges.

Figure 2:
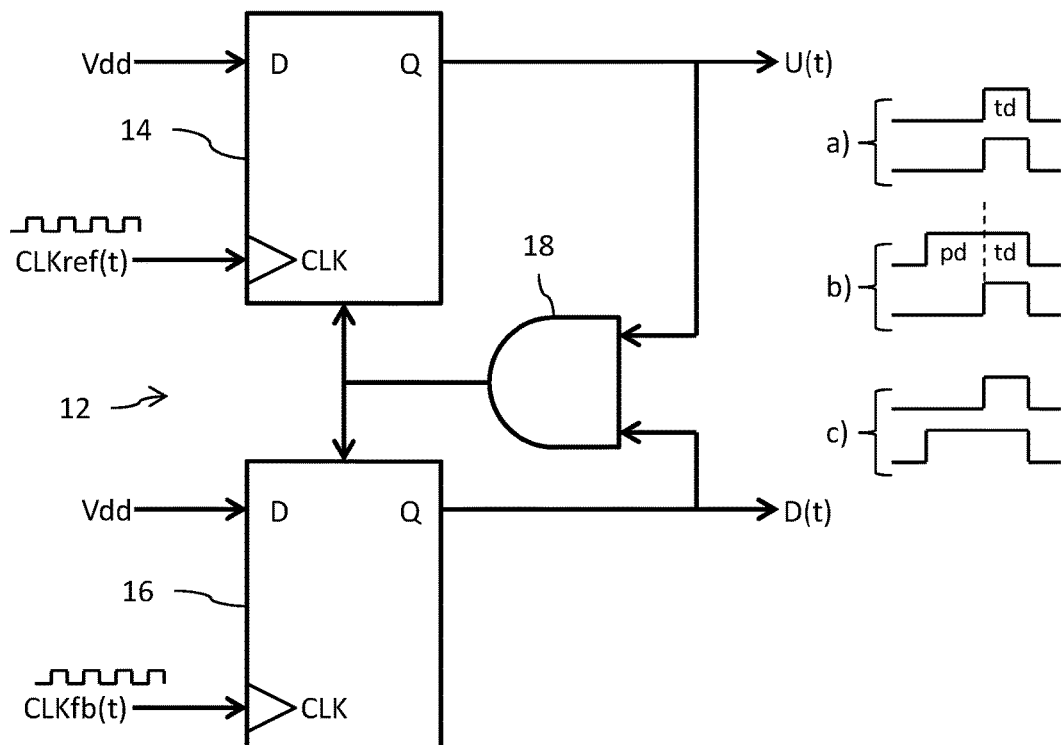
FIG. 2 is a block diagram of a phase frequency detector (PFD) circuit used in the PLL circuit of FIG. 1.

FIG. 2 shows a block diagram of an embodiment of the PFD circuit 12. The PFD circuit 12 includes a first D-type flip flop (FF) circuit 14 having a data (D) input that receives a logic high voltage (Vdd) and a clock (CLK) input that receives the reference clock signal CLKref(t). The output (Q) of the FF circuit 14 generates the up signal U(t). The PFD circuit 12 further includes a second D-type flip flop (FF) circuit 16 having a data (D) input that receives a logic high voltage (Vdd) and a clock (CLK) input that receives the feedback clock signal CLKfb(t). The output (Q) of the FF circuit 16 generates the down signal D(t). A logic AND gate 18 has a first input that receives the up signal U(t) and a second input that receives the down signal D(t). The gate 18 logically ANDs those signals to generate a reset signal that is applied to the reset inputs of the first and second FF circuits 14 and 16.

The waveforms for the up signal U(t) and down signal D(t) are shown in FIG. 2 for the operational cases where: a) like edges of the reference clock signal CLKref(t) and the feedback clock signal CLKfb(t) are aligned; b) the edge of the reference clock signal CLKref(t) leads the like edge of the feedback clock signal CLKfb(t); and c) the edge of the feedback clock signal CLKfb(t) leads the like edge of the reference clock signal CLKref(t). The smaller pulse width for the up signal U(t) and down signal D(t) in cases a), b) and c) is controlled by the time delay (td) for operation of the AND gate 18 to cause the first and second FF circuits 14 and 16 to reset. This is the minimum pulse width for the up signal U(t) and down signal D(t). The longer pulse width for the up signal U(t) and the down signal D(t) in cases b) and c), respectively, is controlled as a function of the sum of the minimum pulse width (td) plus the difference in time (i.e., the phase difference—pd) between the like edges of the reference clock signal CLKref(t) and the feedback clock signal CLKfb(t).

With reference once again to FIG. 1, a charge pump (CP) circuit 20 generates an output current Icp(t) in response to the durations (i.e., widths) of the pulses of the up signal U(t) and the down signal D(t). The CP circuit 20 produces a sourcing current contribution to the charge pump output current Icp(t) in response to the down signal D(t), and produces a sinking current contribution to the charge pump output current Icp(t) in response to the up signal U(t). The output current Icp(t) is dependent on the sourcing current contribution and the sinking current contribution. When the up and down signals have identical pulses, as in case a) noted above, the output current Icp(t) is zero because the sourcing current contribution and the sinking current contribution due the pulses of the up signal U(t) and the down signal D(t) are offset. In the case where the up signal U(t) pulse duration is longer than the down signal D(t) pulse duration, as in case b) noted above, the output current Icp(t) comprises a momentary sinking of current for a duration of the difference in the widths of the pulses of the up signal U(t) and the down signal D(t). Conversely, in the case where the down signal D(t) pulse duration is longer than the up signal U(t) pulse duration, as in the case c) noted above, the output current Icp(t) comprises a momentary sourcing of current for a duration of the difference in the widths of the pulses of the up signal U(t) and the down signal D(t).

Figure 3:
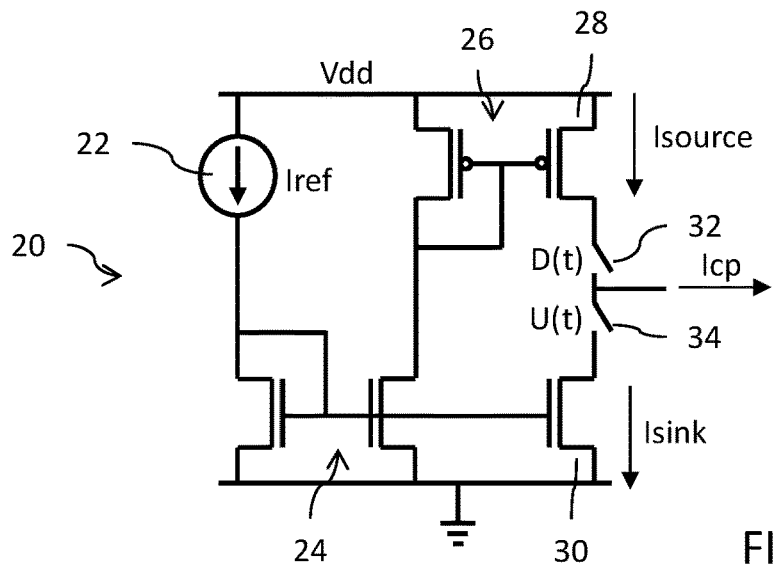
FIG. 3 is a circuit diagram of a charge pump (CP) circuit used in the PLL circuit of FIG. 1.

Reference is now made to FIG. 3 which shows a circuit diagram for the CP circuit 20. A current source 22 generates a reference current Iref. This reference current Iref is mirrored by current mirroring circuits 24 and 26 to generate the sourcing current contribution Isource through p-channel MOSFET transistor 28 and to generate the sinking current contribution Isink through n-channel MOSFET transistor 30 (Isource=Isink). The sourcing current contribution Isource through MOSFET transistor 28 is selectively applied to the output of the CP circuit 20 by actuation of a switch 32 in response to the down signal D(t). The sinking current contribution Isink through MOSFET transistor 30 is selectively applied to the output of the CP circuit 20 by actuation of a switch 34 in response to the up signal U(t). The output current Icp(t) is dependent on the sourcing current Isource contribution and the sinking current Isink contribution.

Figure 4:
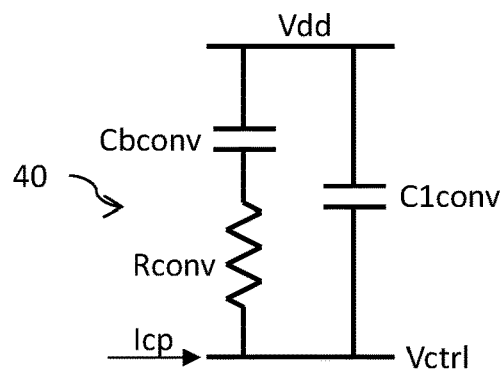
FIG. 4 is a circuit diagram of a loop filter (LF) circuit used in the PLL circuit of FIG. 1.

A loop filter (LF) circuit 40 filters the output current Icp(t) from the charge pump circuit 20 to generate a control voltage Vctrl(t). In an embodiment, the LF circuit 40 is implemented as a passive resistor-capacitor (RC) circuit like that shown in FIG. 4. The filter 40 operates to cause the control voltage Vctrl(t) to incrementally increase in response to each sourcing current contribution Isource of the output current Icp(t) and incrementally decrease in response to each sinking current contribution Isink of the output current Icp(t). It will be noted here that the control voltage Vctrl(t) is referred to the supply voltage Vdd, not the ground voltage Gnd.

A voltage controlled oscillator (VCO) circuit 50 generates an oscillating output signal Vout(t) having a frequency that is controlled by the level of the control voltage Vctrl(t). An increase in the control voltage Vctrl(t) level due to a momentary sourcing current contribution Isource of the output current Icp(t) causes a corresponding decrease in the frequency of the oscillating output signal Vout(t). Conversely, a decrease in the control voltage Vctrl(t) level due to a momentary sinking current contribution Isink of the output current Icp(t) causes a corresponding increase in the frequency of the oscillating output signal Vout(t).

Figure 5:
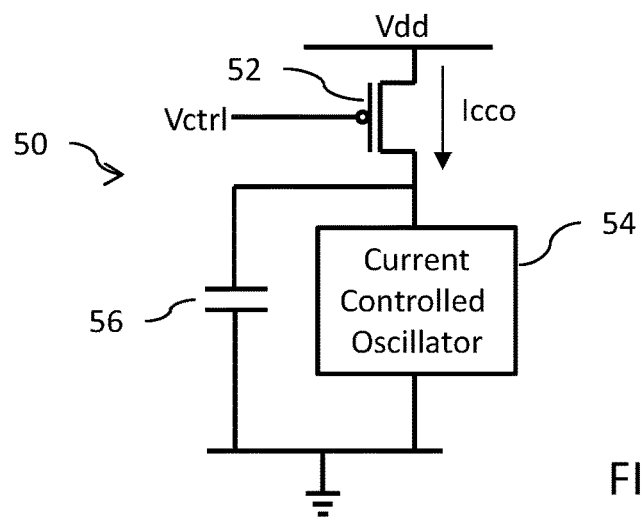
FIG. 5 is a circuit diagram of a voltage controlled oscillator (VCO) circuit used in the PLL circuit of FIG. 1.

Reference is now made to FIG. 5 which shows a circuit diagram for the VCO circuit 50. A p-channel MOSFET transistor 52 has its source connected to the supply voltage Vdd and its gate configured to receive the control voltage Vctrl(t). The transistor 52 functions as a transconductance device converting the control voltage Vctrl(t) to a control current Icco output from the drain. The control current Icco is applied to a current controlled oscillator (CCO) circuit 54 which may be implemented, for example, as a ring oscillator where the current supplied to the power supply node of the ring oscillator 54 controls the frequency at which the binary output signal Vout(t) oscillates. A decrease in the control current Icco (when Vctrl increases due to application of the sourcing current contribution Isource) produces a slower frequency of the oscillating signal Vout(t), and an increase in the control current Icco (when Vctrl decreases due to application of the sinking current contribution Isink) produces a faster frequency of the oscillating signal Vout(t). A capacitor 56 is coupled in parallel with the ring oscillator 54 between its power supply node and the ground. Thus, the voltage across capacitor 56 is referred to the ground.

With reference once again to FIG. 1, a divider circuit 60 frequency divides the oscillating output signal Vout(t) to generate the feedback clock signal CLKfb(t). The divider circuit 60 may be configured to implement either an integer division or a fractional division of the frequency of the oscillating output signal Vout(t) to generate the frequency of the feedback clock signal CLKfb(t).

It will be noted that the control voltage Vctrl(t) for the VCO circuit 50 includes an integral signal component and a proportional signal component. The integral signal component provides integral control of the VCO frequency as the control voltage Vctrl(t) is developed across a capacitance (provided by capacitor Cbconv) of the LF circuit 40 in response to the output current Icp(t) from the CP circuit 20. The proportional signal component provides proportional control of the VCO frequency as the control voltage Vctrl(t) is developed across a resistance (provided by resistor Rconv) of the LF circuit 40. The capacitor Cbconv and resistor Rconv are connected in series with each other in the LF circuit 40 between the supply voltage node Vdd and the gate of transistor 52.

For the transfer function of the PLL circuit 10, the frequency of the zero is given by:

$$f_{zero} = \frac{1}{2\pi \cdot Rconv \cdot Cbconv}$$

Where: Rconv is the resistance of the resistor in the LF circuit 40 and Cbconv is the capacitance of the capacitor connected in series with the resistor in the LF circuit.

The frequency of the unity gain bandwidth is given by:

$$f_{ugb} = \frac{KVCO \cdot Icp \cdot Rconv}{2\pi \cdot N}$$

Where: KVCO is the gain of the VCO circuit 50, Icp is the charge pump current generated by the CP circuit 20, Rconv is the resistance of the resistor in the LF circuit 40 and N is the divisor for the frequency division performed by the divider circuit 60. The gain KVCO is a product of the gain KV2I of the voltage to current conversion performed by the p-channel MOSFET transistor 52 (i.e., the transconductance gm1) and the gain KI2F of the current controlled oscillator 54 (i.e., change in frequency divided by change in input current Icco). So, KVCO=KV2I*KI2F.

An additional pole of the transfer function for the PLL circuit 10 can be added by the capacitance of the capacitor C1conv, with frequency of the pole given by:

$$f_{pole} = \frac{1}{2\pi \cdot Rconv \cdot C1conv}$$

Where it is assumed that the capacitance of capacitor C1conv is substantially less than the capacitance of capacitor Cbconv.

A concern with the PLL circuit 10 as illustrated by FIGS. 1-5 is that resistor noise from the resistor Rconv in the LF circuit 40 can contribute to degrade overall phase noise of the PLL. This noise is also multiplied by the KVCO gain. Furthermore, the capacitor Cbconv used in the LF circuit 30 occupies a large amount of circuit area. Reducing the resistor noise would typically require reduction in resistance of the resistor Rconv and/or a decrease in KVCO. Neither of these options is acceptable. Reducing resistance requires a corresponding increase in the capacitance of capacitor Cbconv (so as to maintain the same frequency location for the zero in the transfer function) resulting in an increase in capacitor area. The reduction in KVCO gain is limited by temperature drift. A passive splitting in the V2I conversion within the VCO circuit 50 can be used, but this will only reduce resistor noise to a certain degree, but cannot eliminate it.

Figure 6:
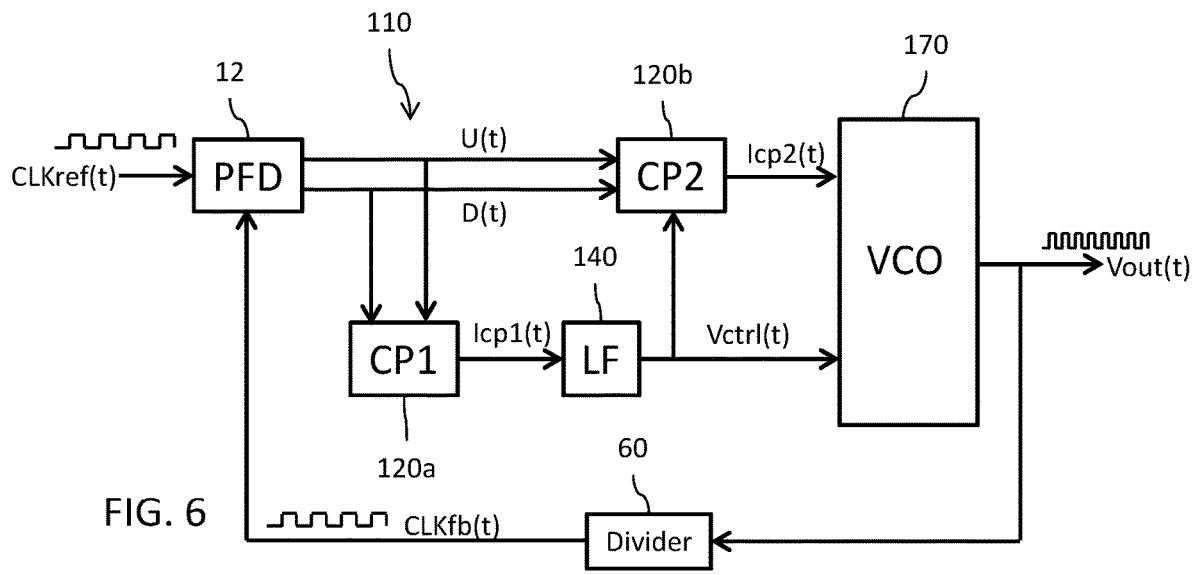
FIG. 6 is a block diagram of a further embodiment of a PLL circuit.

Reference is now made to FIG. 6 which shows a block diagram of a further embodiment of a phase lock loop (PLL) circuit 110. Like references in FIGS. 1 and 6 refer to like or similar components. The circuit 110 addresses concerns with resistor noise without requiring a reduction in KVCO gain or increase in capacitor area, while also allowing for an increase in charge pump current.

A phase-frequency detector (PFD) circuit 12 has a first input that receives a reference clock signal CLKref(t) and a second input that receives a feedback clock signal CLKfb(t). The PFD circuit 12 measures the difference between like edges (i.e., rising edges or falling edges) of the reference clock signal CLKref(t) and the feedback clock signal CLKfb(t). Pulsing of an up signal U(t) and a down signal D(t) output from the PFD circuit 12 are dependent on the detected difference between like edges in the signals CLKref(t) and CLKfb(t). This is discussed in detail above.

A block diagram of an embodiment of the PFD circuit 12 with example waveforms for the up signal U(t) and down signal D(t) for the various operational cases based on the detected difference between like edges in the signals CLKref(t) and CLKfb(t) is shown in FIG. 2 and previously discussed in detail above.

A first charge pump (CP1) circuit 120a generates a first output current Icp1(t) in response to the durations (i.e., widths) of the pulses of the up signal U(t) and the down signal D(t). The CP circuit 120a produces a sourcing current contribution to the charge pump output current Icp1(t) in response to the down signal D(t), and produces a sinking current contribution to the charge pump output current Icp1(t) in response to the up signal U(t). The output current Icp1(t) is dependent on the sourcing current contribution and the sinking current contribution. When the up and down signals have identical pulses, as in case a) noted above, the output current Icp1(t) is zero because the sourcing current contribution and the sinking current contribution due the pulses of the up signal U(t) and the down signal D(t) are offset. In the case where the up signal U(t) pulse duration is longer than the down signal D(t) pulse duration, as in case b) noted above, the output current Icp1(t) comprises a momentary sinking of current for a duration of the difference in the widths of the pulses of the up signal U(t) and the down signal D(t). Conversely, in the case where the down signal D(t) pulse duration is longer than the up signal U(t) pulse duration, as in the case c) noted above, the output current Icp1(t) comprises a momentary sourcing of current for a duration of the difference in the widths of the pulses of the up signal U(t) and the down signal D(t).

Figure 7:
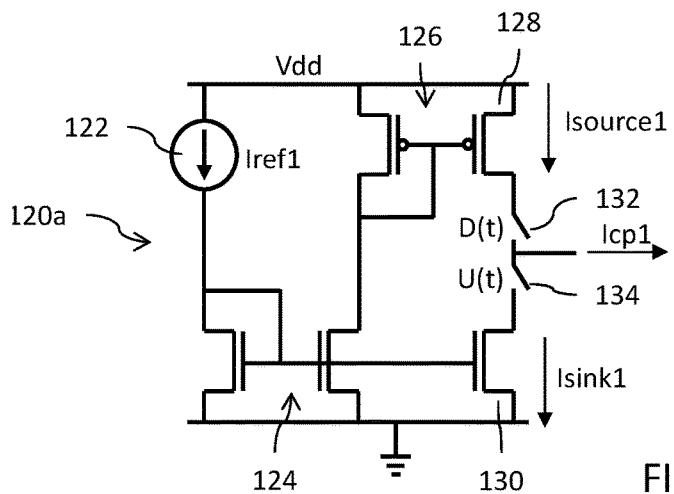
FIG. 7 is a circuit diagram of a first charge pump (CP1) circuit used in the PLL circuit of FIG. 6.

Reference is now made to FIG. 7 which shows a circuit diagram for the first CP1 circuit 120a. A current source 122 generates a reference current Iref1. This reference current Iref1 is mirrored by current mirroring circuits 124 and 126 to generate the sourcing current contribution Isource1 through p-channel MOSFET transistor 128 and to generate the sinking current contribution Isink1 through n-channel MOSFET transistor 130 (Isource1=Isink1). The sourcing current contribution Isource1 through MOSFET transistor 128 is selectively applied to the output of the CP circuit 120a by actuation of a switch 132 in response to the down signal D(t). The sinking current contribution Isink1 through MOSFET transistor 130 is selectively applied to the output of the CP circuit 120a by actuation of a switch 134 in response to the up signal U(t). The output current Icp1(t) is dependent on the sourcing current Isource1 contribution and the sinking current Isink1 contribution.

Figure 8:
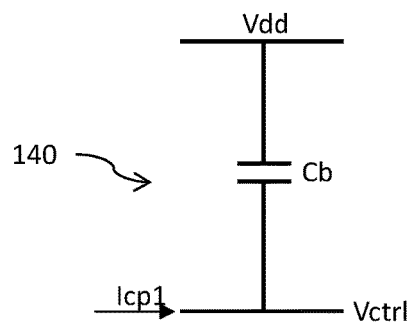
FIG. 8 is a circuit diagram of a loop filter (LF) circuit used in the PLL circuit of FIG. 6.

A loop filter (LF) circuit 140 filters the first output current Icp1(t) from the first charge pump circuit 120a to generate a control voltage Vctrl(t). In an embodiment, the LF circuit 140 is implemented as a passive capacitor (Cb) circuit like that shown in FIG. 8. The filter 140 operates to cause the control voltage Vctrl(t) to incrementally increase in response to each momentary sourcing current contribution Isource of the output current Icp1(t) and incrementally decrease in response to each momentary sinking current contribution Isink1 of the output current Icp1(t). It will be noted here that the control voltage Vctrl(t) is referred to the supply voltage Vdd, not the ground voltage Gnd. It will further be noted that the filter 140 does not include a resistor (compare to FIG. 4).

With reference once again to FIG. 6, a second charge pump (CP2) circuit 120b generates a second output current Icp2(t) in response to the durations (i.e., widths) of the pulses of the up signal U(t) and the down signal D(t), wherein a magnitude of the current Icp2 is dependent on the level of control voltage Vctrl(t) generated by LF circuit 140 in response to the current Icp1 output from the charge pump 120a. The CP2 circuit 120b produces a sourcing current contribution to the charge pump output current Icp2(t) in response to the up signal U(t), and produces a sinking current contribution to the charge pump output current Icp2(t) in response to the down signal D(t). The output current Icp2(t) is dependent on the sourcing current contribution and the sinking current contribution. When the up and down signals have identical pulses, as in case a) noted above, the output current Icp2(t) is zero because the sourcing current contribution and the sinking current contribution due the pulses of the up signal U(t) and the down signal D(t) are offset. In the case where the up signal U(t) pulse duration is longer than the down signal D(t) pulse duration, as in case b) noted above, the output current Icp2(t) comprises a momentary sourcing of current for a duration of the difference in the widths of the pulses of the up signal U(t) and the down signal D(t). Conversely, in the case where the down signal D(t) pulse duration is longer than the up signal U(t) pulse duration, as in the case c) noted above, the output current Icp2(t) comprises a momentary sinking of current for a duration of the difference in the widths of the pulses of the up signal U(t) and the down signal D(t).

Figure 9:
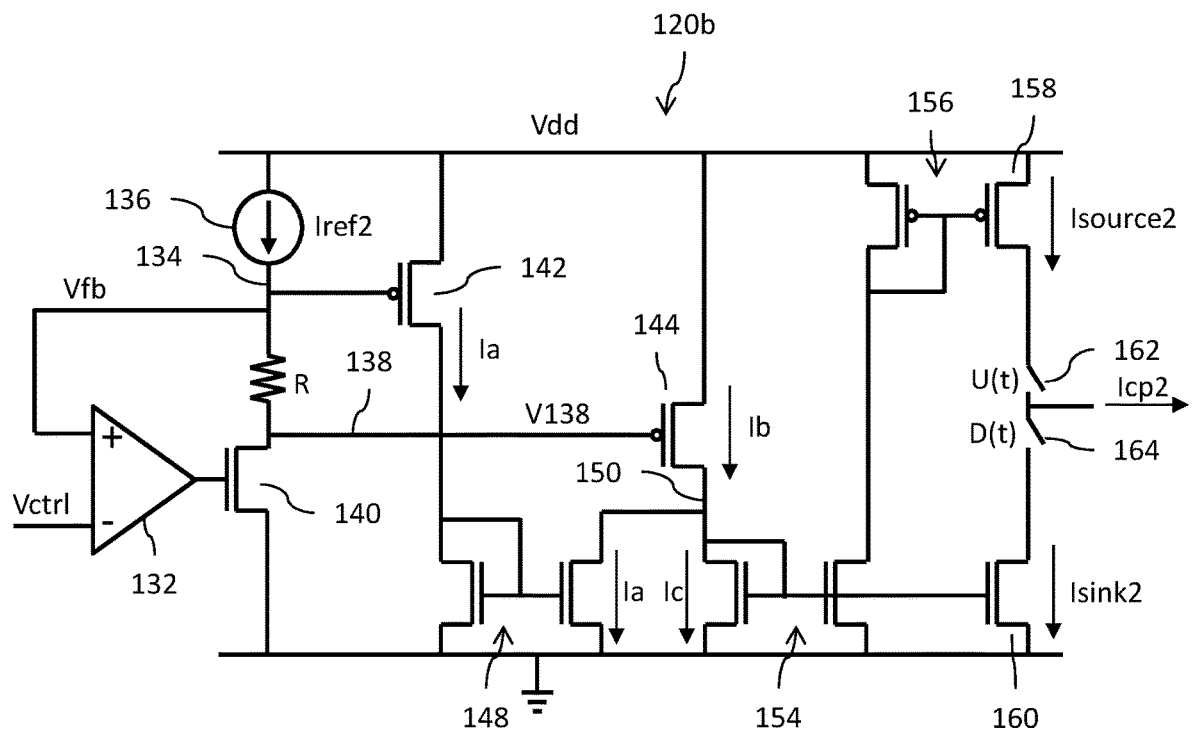
FIG. 9 is a circuit diagram of a second charge pump (CP2) circuit used in the PLL circuit of FIG. 6.

Reference is now made to FIG. 9 which shows a circuit diagram for the second CP2 circuit 120b. An operational amplifier circuit 132 has an inverting (−) input coupled to receive the control voltage Vctrl(t) and a non-inverting (+) input configured to receive a feedback voltage Vfb. The feedback voltage Vfb is generated at node 134. A current source 136 powered from the supply voltage Vdd generates a reference current Iref2 that is sourced to node 134. A resistor R has a first terminal connected to node 134 and a second terminal connected to node 138. An n-channel MOSFET transistor 140 has a drain connected to node 138 and a source connected to ground. A gate of the transistor 140 is driven by the signal generated at the output of the amplifier circuit 132. This circuit configuration is essentially a voltage regulator circuit with two regulated output voltages. The first regulated output voltage is the voltage at node 138, referred to herein as V138, which is equal to Vfb−Iref2*R. The second regulated output voltage is the feedback voltage Vfb which will be substantially equal to Vctrl due to negative feedback. The difference between to the two output voltages is the voltage drop across resistor R which is equal to Iref2*R.

A p-channel MOSFET transistor 142 has its source connected to the supply voltage Vdd and its gate configured to receive the feedback voltage Vfb. The transistor 142 functions as a transconductance device converting the feedback voltage Vfb to a regulated current Ia output from the drain.

A p-channel MOSFET transistor 144 has its source connected to the supply voltage Vdd and its gate configured to receive the voltage V138 at node 138. The transistor 144 functions as a transconductance device converting the voltage V138 to a regulated current Ib output from the drain.

The current Ia is mirrored by a current mirror 148 and subtracted at node 150 from the current Ib to generate a difference current Ic (where Ic=Ib−Ia).

This difference current Ic is mirrored by current mirroring circuits 154 and 156 to generate the sourcing current contribution Isource2 through p-channel MOSFET transistor 158 and to generate the sinking current contribution Isink2 through n-channel MOSFET transistor 160. The sourcing current contribution Isource2 through MOSFET transistor 158 is selectively applied to the output of the CP2 circuit 120b by actuation of a switch 162 in response to the up signal U(t). The sinking current contribution Isink2 through MOSFET transistor 160 is selectively applied to the output of the CP2 circuit 120b by actuation of a switch 164 in response to the down signal D(t). The output current Icp2(t) is dependent on the sourcing current Isource2 contribution and the sinking current Isink2 contribution.

A voltage controlled oscillator (VCO) circuit 170 generates an oscillating output signal Vout(t) having a frequency that is controlled by the level of the control voltage Vctrl(t) and the sourcing and sinking components of the output current Icp2(t). An increase in the control voltage Vctrl(t) level due to a momentary increase in the output current Icp1(t) causes a corresponding decrease in the frequency of the oscillating output signal Vout(t). Conversely, a decrease in the control voltage Vctrl(t) level due to a momentary decrease in the output current Icp(t) causes a corresponding increase in the frequency of the oscillating output signal Vout(t). Furthermore, application of the sourcing current contribution Isource2 of the output current Icp2(t) causes a corresponding increase in the frequency of the oscillating output signal Vout(t), and an application of the sinking current contribution Isink2 of the output current Icp2(t) causes a corresponding decrease in the frequency of the oscillating output signal Vout(t).

Figure 10:
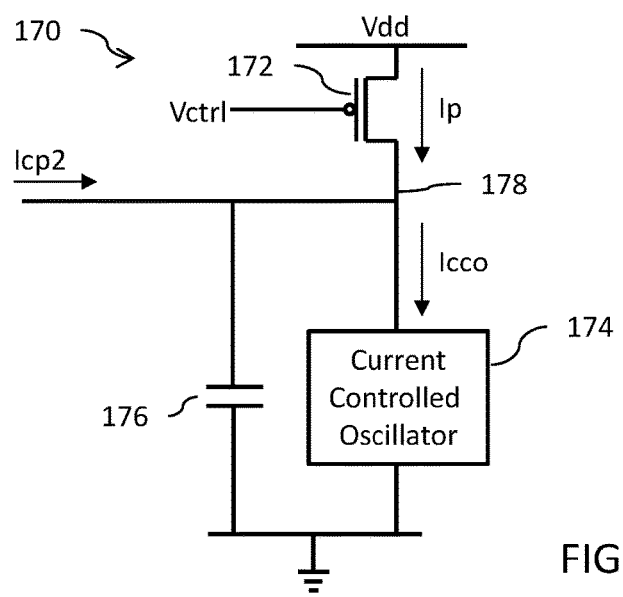
FIG. 10 is a circuit diagram of a voltage controlled oscillator (VCO) circuit used in the PLL circuit of FIG. 6.

Reference is now made to FIG. 10 which shows a circuit diagram for the VCO circuit 170. A p-channel MOSFET transistor 172 has its source connected to the supply voltage Vdd and its gate configured to receive the control voltage Vctrl(t) generated by the loop filter from the output current Icp1(t) output from the charge pump CP1 120a. The transistor 172 functions as a transconductance device converting the control voltage Vctrl(t) to a current Ip output from the drain and applied to node 178. The output current Icp2(t) generated by the charge pump CP2 120b is also applied to the node 178. Node 178 functions as a current summing junction to output a control current Icco (where Icco=Ip+Icp2(t)). The control current Icco is applied to a current controlled oscillator (CCO) circuit 174 which may be implemented, for example, as a ring oscillator where the current supplied to the power supply node (i.e., node 178) of the ring oscillator 174 controls the frequency at which the binary output signal Vout(t) oscillates. A capacitor 176 is coupled in parallel with the ring oscillator 174 between its power supply node and the ground. Thus, the voltage across capacitor 176 is referred to the ground.

With reference once again to FIG. 6, a divider circuit 60 frequency divides the oscillating output signal Vout(t) to generate the feedback clock signal CLKfb(t). The divider circuit 60 may be configured to implement either an integer division or a fractional division of the frequency of the oscillating output signal Vout(t) to generate the frequency of the feedback clock signal CLKfb(t).

It will be noted that the effect of including two charge pump circuits 120a and 120b is to split the integral and proportional control exercised over the VCO frequency. Integral control is provided using charge pump CP1 120a and the LF circuit 140 which includes capacitor Cb (but no resistor, compare to FIG. 4). The integral signal component provides integral control of the VCO frequency as the control voltage Vctrl(t) is developed across a capacitance (provided by capacitor Cb) of the LF circuit 140 in response to the output current Icp1(t) from the charge pump CP1 120*a*. Proportional control is provided using charge pump CP2 120*b*. The proportional signal component provides proportional control of the VCO frequency as the output current Icp2(t) generated by the charge pump CP2 120*b* is applied directly to the power supply node of the current controlled oscillator 174.

For the transfer function of the PLL circuit 110, the frequency of the zero is given by:

$$f_{zero} = \frac{1}{2\pi \cdot Req \cdot Cb}$$

$$\text{Where: } Req = \frac{Icp2}{Icp1 \cdot gm1}$$

Where: Cb is the capacitance of the capacitor in the loop filter 140, Icp2 is the current of the charge pump circuit 120*b*, Icp1 is the current of the charge pump circuit 120*a*, and gm1 is the transconductance of the MOSFET transistor 172.

The frequency of the unity gain bandwidth is given by:

$$f_{ugb} = \frac{Icp2 \cdot KI2F}{2\pi \cdot N}$$

Where: KI2F is the gain of the current controlled oscillator 174 (i.e., change in frequency divided by change in input current Icco) and Icp2 is the current of the charge pump CP2 120*b*.

In order for the loop parameters (i.e., the frequency of the zero and the frequency of the unity gain bandwidth) for the PLL circuit 110 to match the loop parameters of the PLL circuit 10 of FIG. 1, then:

$$Icp2 = KV2I \cdot Icp * Rconv = gm1 \cdot Icp \cdot Rconv$$

and:

$$f_{zero} = \frac{1}{2\pi \cdot Req \cdot Cb} = \frac{1}{2\pi \cdot Rconv \cdot Cbconv}$$

Where: KV2I is gain of the voltage to current conversion performed by the p-channel MOSFET transistor 52, Icp is the current of the charge pump circuit 20, Rconv is the resistance for the proportional control provided by loop filter 40, gm1 is the transconductance of the MOSFET transistor 172, Req is as defined above, and Cbconv is the capacitance of the capacitor in the loop filter circuit 40.

It will be noted then that the current Icp2 of the charge pump CP2 120*b* can be set at a magnitude which is higher than the current Icp of the charge pump CP 20 in the PLL circuit 10 of FIG. 1. This increased magnitude of charge pump current makes it easier to implement a fractional cancelation digital-to-analog converter (DAC) and achieve a satisfactory linearity. The resistor noise can now be eliminated as it can be filtered off in the proportional charge pump CP2 120*b*. Also, since the noise will be duty cycled in the proportional charge pump CP2 120*b*, it will be still further reduced.

Another advantage of the circuit 110 over the circuit 10 is that the resistance Req can be independently increased by reducing the current Icp1 for the charge pump CP1 120*a*. As a result, there can be a corresponding decrease in the capacitance of the capacitor Cb in the loop filter 140, with a corresponding decrease in occupied circuit area.

It is difficult in the charge pump circuit 10 to make the zero frequency programmable using only passive components (i.e., resistors, capacitors). This can contribute to leakage on the high impedance node at the output of the charge pump circuit 20, and thereby increase the reference spur. However, in the PLL circuit 110, the zero frequency is readily programmable through setting of any one or more of the following parameters: Icp1, Icp2, gm1 in order to program the resistance Req.

It will also be noted that in the PLL circuit 110, the current generation circuitry within the second charge pump CP2 120*b* operates to generate the charge pump current Icp2 (see, current Ia and current Ib) that is proportional to the transconductance (gm2) of the MOSFET transistors 142 and 144. Because of this, the charge pump current Icp2 will have a similar spread with respect to the transconductance (gm1) of the MOSFET transistor 172 in the VCO circuit 170. By doing this, the loop dynamics and the spread of the unity gain bandwidth frequency and zero frequency across process-voltage-temperature (PVT) will be like that with the PLL circuit 10 of FIG. 1.

The implementation shown in FIGS. 6-10 provides a circuit where the current Icp2 of the second charge pump CP2 120*b* is dependent on the current Icp1 of the first charge pump CP1 120*a* through the use of the control voltage Vctrl(t) in generating the biasing voltages Vfb and V138 for the transconductance MOSFETs 142 and 144, respectively. However, in an alternative implementation, the current Icp2 of the second charge pump CP2 120*b* can be made independent of the current Icp1 of the first charge pump CP1 120*a*.

Figure 11:
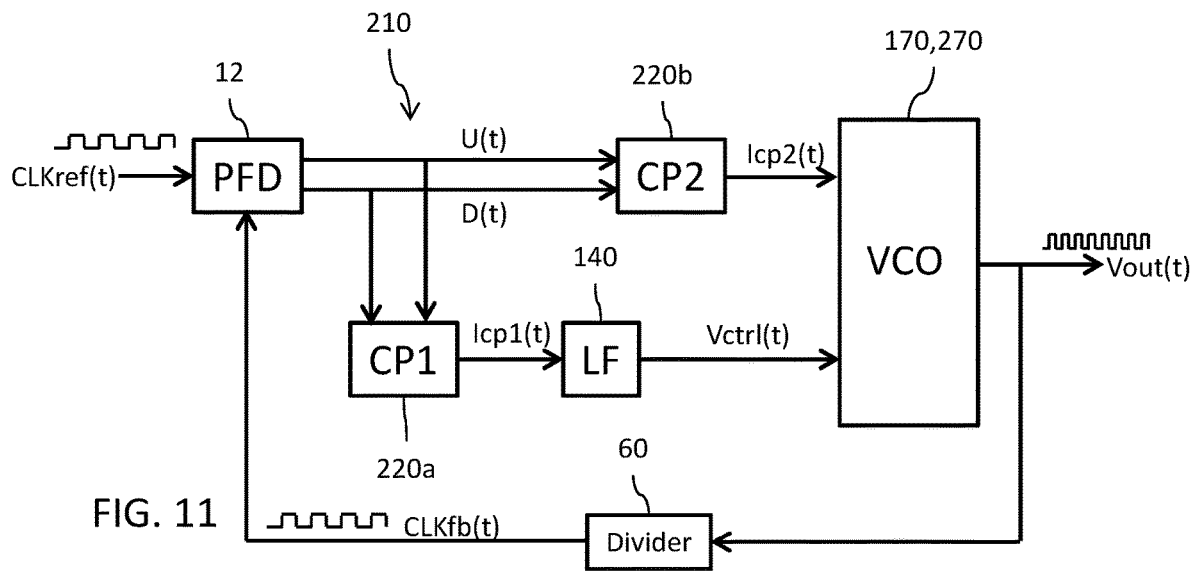
FIG. 11 is a block diagram of a further embodiment of a PLL circuit.

Reference is now made to FIG. 11 which shows a block diagram of a further embodiment of a phase lock loop (PLL) circuit 210. Like references in FIGS. 6 and 11 refer to like or similar components. The circuit 210 differs from the circuit 110 primarily in that the second charge pump circuit 220*b* generates the current Icp2 for the proportional control component in a manner which is independent of the current Icp1 for the integral control component as generated by the first charge pump circuit 220*a*. The circuits 12, 140, 170 and 60 as shown in FIG. 11 are identical to the corresponding circuits 12, 140, 170 and 60 as shown in FIGS. 2, 6, 8 and 10, the description of which will not be repeated.

Figure 12:
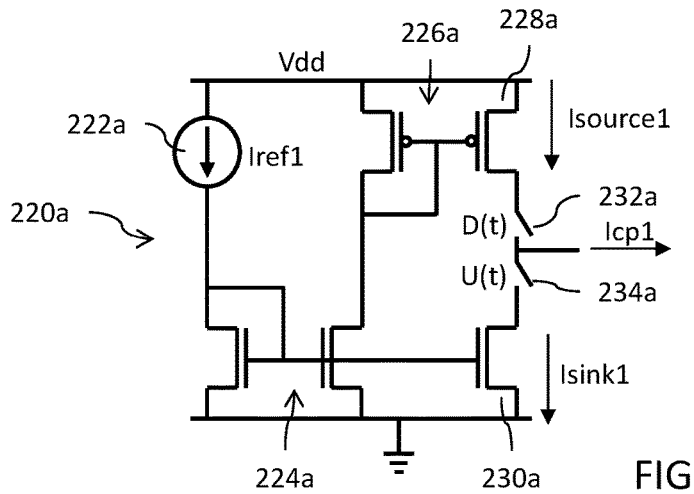
FIG. 12 is a circuit diagram of a first charge pump (CP1) circuit used in the PLL circuit of FIG. 11.

The first charge pump circuit 220*a* is more or less identical to the first charge pump circuit 120*a* as shown in FIG. 7 previously described herein. FIG. 12 shows a circuit diagram for the first CP circuit 220*a*. A current source 222*a* generates a reference current Iref1. This reference current Iref1 is mirrored by current mirroring circuits 224*a* and 226*a* to generate the sourcing current contribution Isource1 through p-channel MOSFET transistor 228*a* and to generate the sinking current contribution Isink1 through n-channel MOSFET transistor 230*a*. The sourcing current contribution Isource1 through MOSFET transistor 228*a* is selectively applied to the output of the CP circuit 220*a* by actuation of a switch 232*a* in response to the down signal D(t). The sinking current contribution Isink through MOSFET transistor 230*a* is selectively applied to the output of the CP circuit 220a by actuation of a switch 234a in response to the up signal U(t). The output current Icp1(t) is the difference between the sourcing current Isource1 contribution and the sinking current Isink1 contribution (where Icp1=Isource1−Isink1).

Figure 13:
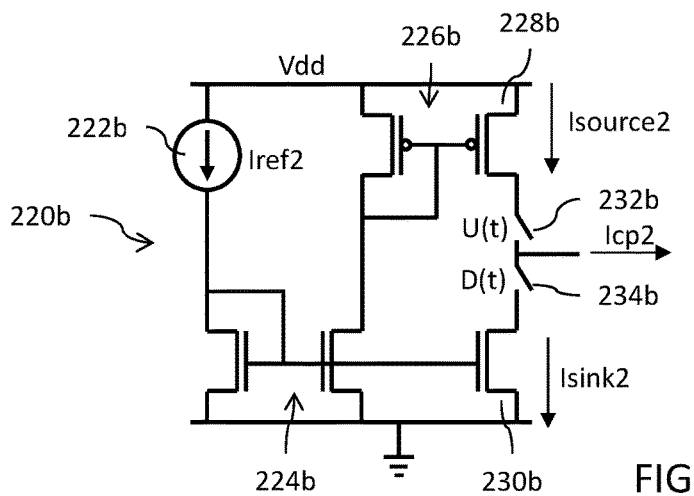
FIG. 13 is a circuit diagram of a second charge pump (CP2) circuit used in the PLL circuit of FIG. 11.

Reference is now made to FIG. 13 which shows a circuit diagram for the second charge pump circuit 220b. A current source 222b generates a reference current Iref2. This reference current Iref2 is mirrored by current mirroring circuits 224b and 226b to generate the sourcing current contribution Isource2 through p-channel MOSFET transistor 228b and to generate the sinking current contribution Isink2 through n-channel MOSFET transistor 230b. The sourcing current contribution Isource2 through MOSFET transistor 228b is selectively applied to the output of the CP circuit 220b by actuation of a switch 232b in response to the up signal U(t). The sinking current contribution Isink2 through MOSFET transistor 230b is selectively applied to the output of the CP circuit 220b by actuation of a switch 234b in response to the down signal D(t). The output current Icp2(t) is the difference between the sourcing current Isource2 contribution and the sinking current Isink2 contribution (where Icp2=Isource2−Isink2).

For the transfer function of the PLL circuit 110, the frequency of the zero is given by:

$$f_{zero} = \frac{1}{2\pi \cdot Req \cdot Cb}$$

Where: $Req = \frac{Icp2}{Icp1 \cdot gm1}$

Where: Cb is the capacitance of the capacitor in the loop filter 140, Icp2 is the current of the charge pump circuit 220b, Icp1 is the current of the charge pump circuit 220a, and gm1 is the transconductance of the MOSFET transistor 172.

The frequency of the unity gain bandwidth is given by:

$$f_{ugb} = \frac{Icp2 \cdot KI2F}{2\pi \cdot N}$$

Where: KI2F is gain of the current to frequency conversion, Icp2 is the current of the charge pump circuit, and N is the division factor.

Thus, it will be noted that the loop parameters (i.e., the frequency of the zero and the frequency of the unity gain bandwidth) for the PLL circuit 210 match the loop parameters of the PLL circuit 110 of FIG. 6.

Figure 14:
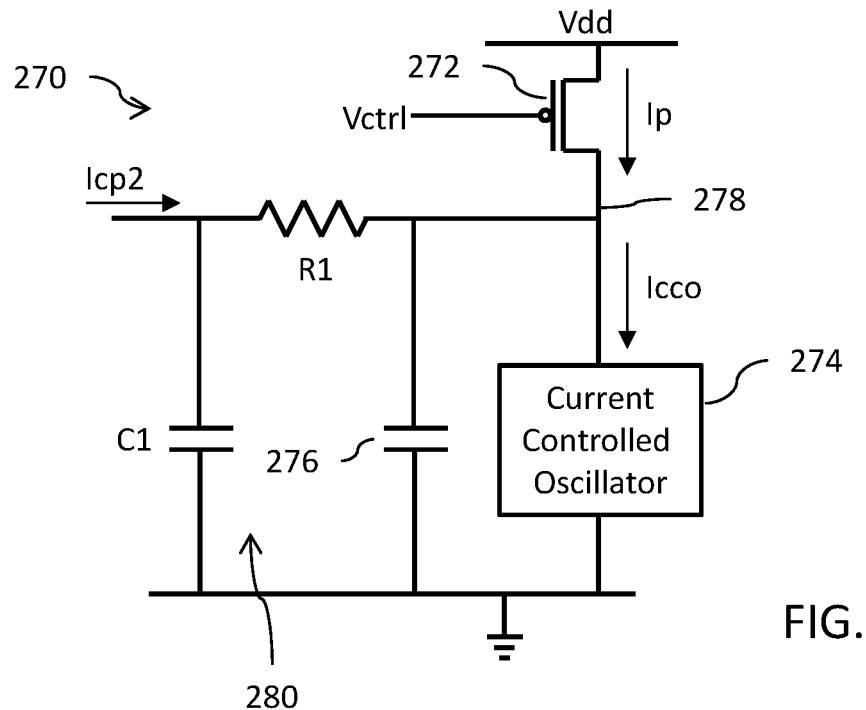
FIG. 14 is a circuit diagram of an alternative embodiment for a voltage controlled oscillator (VCO) circuit used in the PLL circuit of FIG. 11.

The PLL circuit 210 may alternatively utilize a VCO circuit 270 as shown in FIG. 14. A p-channel MOSFET transistor 272 has its source connected to the supply voltage Vdd and its gate configured to receive the control voltage Vctrl(t) generated by the loop filter 140 from the output current Icp1(t) output from the first charge pump 220a. The transistor 272 functions as a transconductance device converting the control voltage Vctrl(t) to a current Ip output from the drain and applied to node 278. The output current Icp2(t) generated by the second charge pump 120b is applied to the node 278 through a filter circuit 280. The filter circuit 280 includes a resistor R1 having a first terminal configured to receive the output current Icp2(t) and a second terminal connected to node 278, and a capacitor C1 having a first terminal connected to the first terminal of resistor R1 and a second terminal connected to ground. Node 278 functions as a current summing junction to output a control current Icco (where Icco=Ip+Icp2(t) (filtered)). The control current Icco is applied to a current controlled oscillator (CCO) circuit 274 which may be implemented, for example, as a ring oscillator where the current supplied to the power supply node (i.e., node 278) of the ring oscillator 274 controls the frequency at which the binary output signal Vout(t) oscillates. A capacitor 276 is coupled in parallel with the ring oscillator 274 between its power supply node and the ground. Thus, the voltage across capacitor 276 is referred to the ground.

The effect of the filter circuit 280 is to add a third pole in the transfer function of the PLL loop circuit 210. For the transfer function of the PLL circuit 210, the frequency of the added pole is given by:

$$f_{pole} = \frac{1}{2\pi \cdot (R1 + Rthev) \cdot C1} \approx \frac{1}{2\pi \cdot R1 \cdot C1}$$

Where the following assumptions are made:

Rthev·Cc<<(R1+Rthev)·C1 and

Rthev<<R1

Here, Rthev represents the equivalent Thevenin resistance of the current controlled oscillator 274, and Cc is the capacitance of the capacitor 276.

Figure 15:
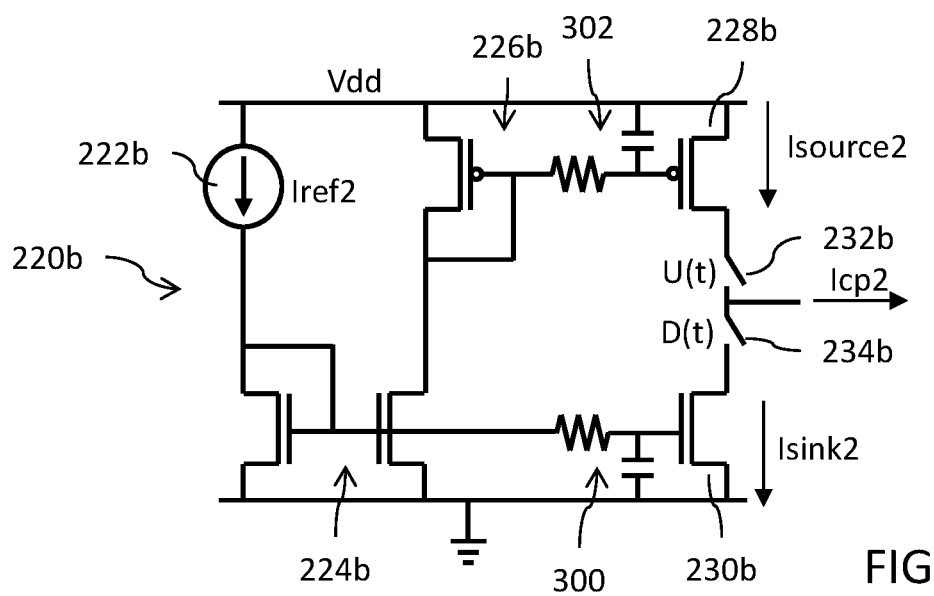
FIG. 15 is a circuit diagram of an alternative embodiment for a second charge pump (CP2) circuit used in the PLL circuit of FIG. 11.

To address concerns with charge pump noise, the second CP circuit 220b may include low pass filtering as shown in FIG. 15. Like references in FIGS. 13 and 15 refer to like or similar components, the description of which will not be repeated. The second CP circuit 220b of FIG. 15 differs from the second CP circuit 220b of FIG. 13 in the inclusion of a first low pass resistor-capacitor (RC) filter 300 on the common gate line for the current mirror 224b and a second low pass resistor-capacitor (RC) filter 302 on the common gate line for the current mirror 226b.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A phase lock loop (PLL) circuit, comprising:
  a phase-frequency detector (PFD) circuit configured to determine a difference between a reference clock signal and a feedback clock signal and generate up/down control signals in response to said difference;
  a first charge pump operating in response to the up/down control signals to generate a first charge pump current;
  a loop filter comprising a capacitor but no resistor that filters the first charge pump signal to generate a control voltage;
  a second charge pump operating in response to the up/down control signals to generate a second charge pump current, wherein the second charge pump further receives the control voltage and the second charge pump current is generated dependent on both the control voltage and the up/down control signals;

a voltage controlled oscillator comprising:
   a first transconductance circuit controlled by said control voltage to generate a first transconductance current;
   a current summing node configured to sum the first transconductance current with the second charge pump current to generate a control current; and
   a current controlled oscillator configured to generate an oscillating output signal having a frequency controlled by said control current; and
a divider circuit configured to frequency divide the oscillating output signal to generate the feedback clock signal.

2. The PLL circuit of claim 1, wherein the second charge pump further includes low pass filter circuitry configured to filter noise from the second charge pump current.

3. The PLL circuit of claim 1, further comprising a filter circuit configured to filter the second charge pump current before application to the current summing node.

4. The PLL circuit of claim 1, wherein the first charge pump circuit comprises:
   a reference current generator;
   current mirroring circuitry configured to generate a sourcing current and a sinking current from the reference current;
   a first switching circuit actuated in response to one of said up/down control signals to apply the sourcing current to the first charge pump current; and
   a second switching circuit actuated in response to another of said up/down control signals to apply the sinking current to the first charge pump current.

5. The PLL circuit of claim 4, where said one of said up/down control signals is a down control signal and said another of said up/down control signals is an up signal.

6. The PLL circuit of claim 1, wherein the second charge pump circuit comprises:
   a reference current generator;
   current mirroring circuitry configured to generate a sourcing current and a sinking current from the reference current;
   a first switching circuit actuated in response to one of said up/down control signals to apply the sourcing current to the second charge pump current; and
   a second switching circuit actuated in response to another of said up/down control signals to apply the sinking current to the second charge pump current.

7. The PLL circuit of claim 6, where said one of said up/down control signals is an up control signal and said another of said up/down control signals is a down signal.

8. The PLL circuit of claim 6, further comprising low pass filter circuitry on control nodes of the current mirroring circuitry to filter noise from the sourcing and sinking currents.

9. A phase lock loop (PLL) circuit, comprising:
   a phase-frequency detector (PFD) circuit configured to determine a difference between a reference clock signal and a feedback clock signal and generate up/down control signals in response to said difference;
   a first charge pump operating in response to the up/down control signals to generate a first charge pump current;
   a loop filter comprising a capacitor but no resistor that filters the first charge pump signal to generate a control voltage;
   a second charge pump operating in response to the up/down control signals to generate a second charge pump current;
   a voltage controlled oscillator comprising:
     a first transconductance circuit controlled by said control voltage to generate a first transconductance current;
     a current summing node configured to sum the first transconductance current with the second charge pump current to generate a control current; and
     a current controlled oscillator configured to generate an oscillating output signal having a frequency controlled by said control current; and
   a divider circuit configured to frequency divide the oscillating output signal to generate the feedback clock signal; and
   wherein the second charge pump circuit comprises:
     a voltage regulator circuit configured to generate a first regulated voltage and a second regulated voltage in response to the control voltage;
     a second transconductance circuit controlled by said first regulated voltage to generate a second transconductance current;
     a third transconductance circuit controlled by said second regulated voltage to generate a third transconductance current;
     a current differencing circuit configured to subtract the second transconductance current from the third transconductance current to generate a difference current;
     current mirroring circuitry configured to generate a sourcing current and a sinking current from the difference current;
     a first switching circuit actuated in response to one of said up/down control signals to apply the sourcing current to the second charge pump current; and
     a second switching circuit actuated in response to another of said up/down control signals to apply the sinking current to the second charge pump current.

10. The PLL circuit of claim 9, where said one of said up/down control signals is an up control signal and said another of said up/down control signals is a down signal.

11. The PLL circuit of claim 9, further comprising low pass filter circuitry on control nodes of the current mirroring circuitry to filter noise from the sourcing and sinking currents.

12. A phase lock loop (PLL) circuit, comprising:
   a phase-frequency detector (PFD) circuit configured to determine a difference between a reference clock signal and a feedback clock signal and generate up/down control signals in response to said difference;
   charge pump and loop filter circuitry configured to generate an integral signal component control signal and a proportional signal component control signal in response to said up/down control signals;
   wherein said integral signal component control signal and said proportional signal component control signal are separate control signals;
   a voltage controlled oscillator configured to generate an oscillating output signal having a frequency controlled by said integral signal component control signal and said proportional signal component control signal; and
   a divider circuit configured to frequency divide the oscillating output signal to generate the feedback clock signal; and
   wherein said charge pump and loop filter circuitry comprises:
     a first charge pump operating in response to the up/down control signals to generate a first charge pump current;

a loop filter that filters the first charge pump signal to generate a control voltage which forms said integral signal component control signal; and a second charge pump operating in response to the up/down control signals to generate a second charge pump current which forms said proportional signal component control signal, wherein the second charge pump further receives the control voltage and the second charge pump current is generated dependent on both the control voltage and the up/down control signals.

13. The PLL circuit of claim 12, wherein voltage controlled oscillator comprises:

a first transconductance circuit controlled by said integral signal component control signal to generate a first transconductance current;

a current summing node configured to sum the first transconductance current with a proportional current derived from the proportional signal component control signal to generate a control current; and a current controlled oscillator configured to generate an oscillating output signal having a frequency controlled by said control current.

14. The PLL circuit of claim 12, wherein voltage controlled oscillator comprises a current controlled oscillator configured to generate an oscillating output signal having a frequency controlled by a control current, and wherein a magnitude of said control current is set in response to each of said integral signal component control signal and said proportional signal component control signal.

15. The PLL circuit of claim 14, wherein the voltage controlled oscillator further comprises a current summing junction configured to generate said control current as a sum of a first current derived from said integral signal component control signal and a second current derived from said proportional signal component control signal.

16. The PLL circuit of claim 12, wherein loop filter comprises a capacitor but no resistor for filtering the first charge pump signal to generate the control voltage.

17. The PLL circuit of claim 16, wherein the second charge pump further includes low pass filter circuitry configured to filter noise from the second charge pump current.

18. The PLL circuit of claim 12, further comprising a filter circuit configured to filter proportional signal component control signal before application to the voltage controlled oscillator.

* * * * *